United States Patent [19]

Dyer

[11] Patent Number: 5,744,400
[45] Date of Patent: Apr. 28, 1998

[54] APPARATUS AND METHOD FOR DRY MILLING OF NON-PLANAR FEATURES ON A SEMICONDUCTOR SURFACE

[75] Inventor: Timothy Scott Dyer, Tempe, Ariz.

[73] Assignee: Accord Semiconductor Equipment Group, Tempe, Ariz.

[21] Appl. No.: 643,575

[22] Filed: May 6, 1996

[51] Int. Cl.$^6$ .................. C23F 1/04; H01L 21/473
[52] U.S. Cl. .................. 438/631; 438/633; 438/712; 438/716; 156/345 B; 204/192.34; 204/192.37; 204/298.35; 204/298.36
[58] Field of Search .................. 156/345 B; 216/38, 216/66; 204/298.36, 298.35, 192.34, 192.37

[56] References Cited

U.S. PATENT DOCUMENTS

| | | | |
|---|---|---|---|
| 4,025,411 | 5/1977 | Hom-Ma et al. | 216/66 |
| 4,128,765 | 12/1978 | Franks | 204/298.35 |
| 4,460,434 | 7/1984 | Johnson et al. | 156/643.1 |
| 4,604,176 | 8/1986 | Paul | 204/192.34 |
| 4,694,564 | 9/1987 | Enoki et al. | 437/40 |
| 4,906,594 | 3/1990 | Yoneda et al. | 204/192.34 |
| 5,091,048 | 2/1992 | Thomas | 204/192.34 |

FOREIGN PATENT DOCUMENTS

| | | |
|---|---|---|
| 33-146933 A | 11/1980 | Japan . |
| 61-289635 A | 12/1986 | Japan . |
| 63-188812 A | 8/1988 | Japan . |

OTHER PUBLICATIONS

Aliotta et al "Planarization of organic coatings by directing a milling ion beam on the surface at an acute angle" IBM Tech. Discl. Bull. vol. 27, No. 7B, p. 4128 Dec. 1984.

*Primary Examiner*—Nam Nguyen
*Assistant Examiner*—Anita Alanko
*Attorney, Agent, or Firm*—Herbert M. Shapiro

[57] ABSTRACT

An ion milling technique for forming non-planar features on a semiconductor wafer into relatively planar features for further layer deposition replaces the conventional polishing technique currently in use. The technique employs a first ion gun directing a beam normal to the wafer surface and operative to impact the features uniformly to exaggerate the hills of the feature into steep peaks and to form the valleys therebetween into shallow valleys. The technique also employs a second ion gun directed normal to the steep slopes of the peaks and aimed at a portion of the radius of the wafer while the wafer is rotated. The second beam takes advantage of the fact that the peaks mill at a rate twice as fast as the shallow valleys and the first ion beam operates to magnify the aspect ratio between the peaks and the valleys to ensure that the different rates of milling actually occurs when the second ion beam is brought into play.

9 Claims, 3 Drawing Sheets

APPARATUS AND METHOD FOR DRY MILLING OF NON-PLANAR FEATURES ON A SEMICONDUCTOR SURFACE

FIELD OF THE INVENTION

This invention relates to techniques for milling features formed on a semiconductor wafer surface to make the featured surface relatively flat for receiving additional deposited layers.

BACKGROUND OF THE INVENTION

The fabrication of semiconductor devices starts with a semiconductor wafer of, for example, silicon commonly about eight inches in diameter. The wafer has a flat surface upon which an epitaxial layer is grown. Further processing comprises the formation of patterns of photoresist, electrical conductors and silicon oxides which are used to define discrete areas into which minority carriers are diffused and to define and to insulate electrical conductor paths as is well understood in the art.

As a consequence of such patterning, the resulting wafer surface is not sufficiently planar to receive subsequent layers necessary for device operation. The non-planar surface has to be processed to form a relatively flat surface to receive such layers. Presently, an extra thickness of, say aluminum which forms the conductor pattern, is deposited and polished down to provide a sufficiently flat surface for later processing. In practice, a patterned layer of aluminum one micron thick with a two micron quartz insulating layer, on top and between the aluminum features, is deposited and polished flat as is necessary for further device fabrication.

Such polishing, at present, requires a slurry which introduces unwanted contaminants into the wafer, is time consuming to perform and is environmentally invasive.

BRIEF DESCRIPTION OF THE INVENTION

In accordance with the principles of this invention, an ion milling technique is used to minimize the non-planar features formed on a semiconductor wafer for readying the surface for further processing. The technique takes advantage of the fact that features with sharp peaks are milled at a rate much faster than more even portions of such features. To turn such a characteristic to account, the technique employs a first ion gun aimed along an axis normal to the wafer surface to direct an ion beam uniformly over the entire surface of the featured wafer to form the features into sharp peaks and shallow valleys therebetween. The technique then employs a second ion gun which directs an ion beam over a radial portion of the featured surface as the wafer is rotated. The first gun is operated for a time and at an intensity to form the features into sharp peaks and shallow valleys. The second is directed along an axis perpendicular to the slope of the peaked features and is operated for a time and at an intensity to remove the peaks as the wafer turns. A dry, slurry-free, environmentally safe procedure results.

DETAILED DESCRIPTION OF AN ILLUSTRATIVE EMBODIMENT OF THIS INVENTION

Figure 1:
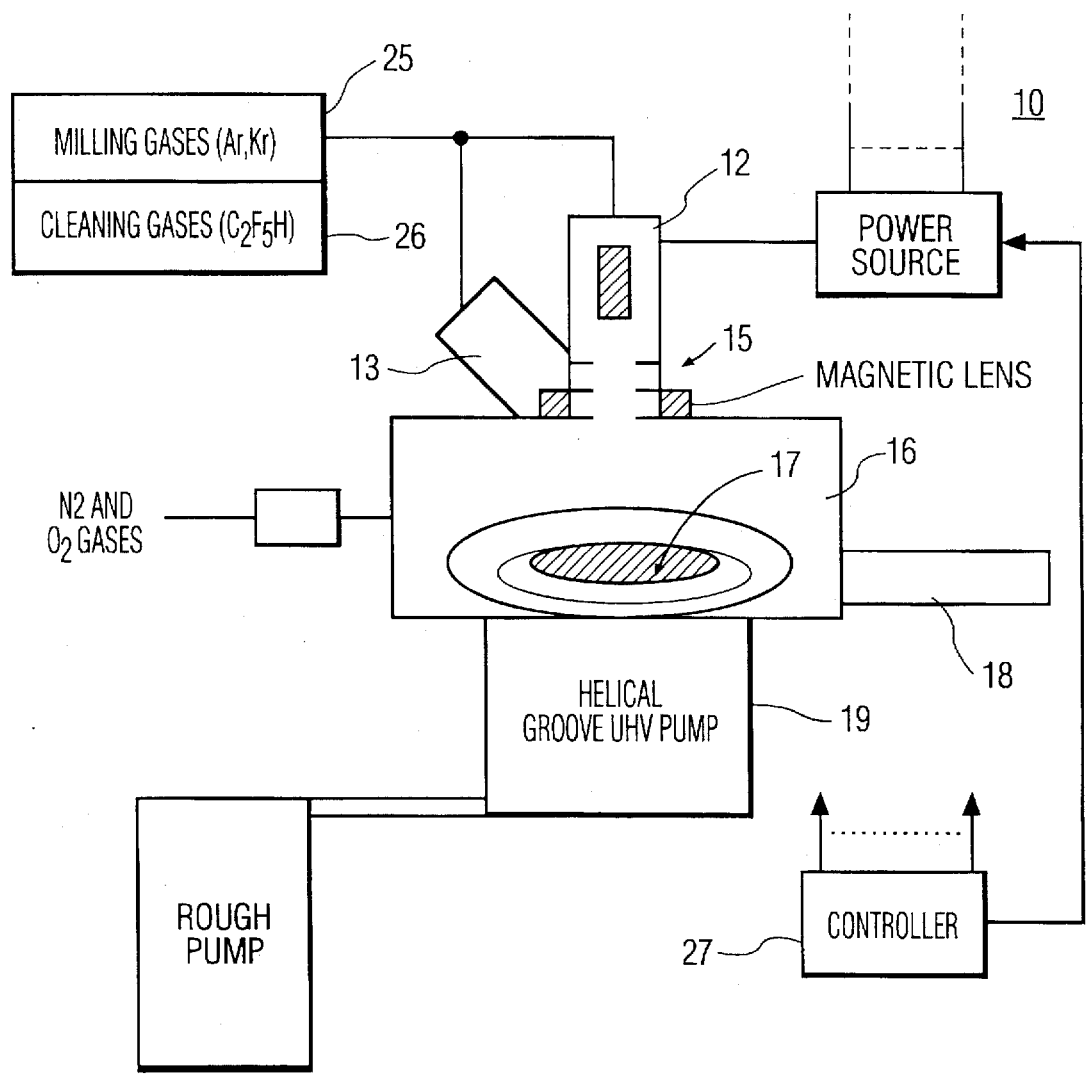
FIG. 1 is a schematic block diagram of a dry ion milling apparatus in accordance with the principles of this invention.

FIG. 1 shows an ion gun apparatus 10 in accordance with the principles of this invention. The apparatus includes first and second ion beam guns 12 and 13 respectively. Each of the guns includes accelerator vanes shown in gun 12 only and identified there as item 15. Each gun is positioned to direct an ion beam into vacuum chamber 16. A wafer 17 to be milled is placed in chamber 16 and is retained in position by an electrostatic chuck common to such apparatus. The power supply and control for the chuck is designated 18 in the figure.

The electrostatic chuck includes means for rotating the wafer and to clamp the wafer so that helium gas can cool the wafer (via increased backside pressure). The apparatus (10) also includes a pump for producing a vacuum in chamber 16 for ion milling to occur therein. Importantly, the apparatus (10) includes a second ion gun which is positioned at an angle to the first gun at an orientation essentially normal to the slope of hills (or hillocks) of the coated conductor features formed on the semiconductor surface during fabrication. The vacuum pump employed herein can be any type of high vacuum compatible pump. A high capacity turbo pump or a helical vacuum pump are suitable.

The first ion gun directs a beam uniformly over the entire featured wafer surface to exaggerate the hills, noted above, into sharp peaks and shallow valleys. The second ion gun directs an ion beam at the wafer radius and the wafer is rotated to mill the sharp peaks at a relatively fast rate (2 to 3 times faster) when compared to the rate at which the shallow valleys are milled thereby. As is customary in the art, the silicon oxide (Quartz) is formed to a thickness greater than necessary to permit later polishing to achieve the desired degree of flatness for successful later processing and in practice, half the deposited Quartz thickness is polished away (in a slurry) to this end. Similarly, the Quartz is deposited to a thickness (two microns) greater than necessary and again half (one micron) is milled away, but with a quicker, less time consuming and environmentally safer technique in accordance with the principles of this invention.

Sources of gases, necessary for ion milling, are represented by blocks 25 and 26 and are operative under the control of controller 27. Controller 27 may be any such device capable of controlling the power source, the current-ion source, the accelerator vanes, the rotary electrostatic chuck, the gas sources and the pumps herein and may comprise a conventional microprocessor.

The ion milling process parameters are as follows:

Ion Mill Planarization Gasses and flow rates:

| Gas Name | Typical Flow Range | Function |
| --- | --- | --- |
| Ar | 200–1000 sccm | Physical etch |
| Kr | 50–500 sccm | Energetic Physical Etch |
| $C_2F_5H$ | 300–500 sccm | Reactor cleaning/Chemical Etch |
| $N_2$ | 100–500 sccm | Process Tuning |
| $O_2$ | 700–1500 sccm | Reactor Cleaning/ashing |

Electrostatic Chuck (ESC) D.C. Bias: −600 to−1200 Volts D.C.

ESC Angular Velocity (Rotation Rate) 50–300 R.P.M.

Wafer Temperature: less than 400 degrees C

Helium Backside Cooling Pressure: 5–15 Torr

Accelerator Grid Voltage: −300 to −1500 Volts

Primary Magnetic Field (lens) 600–800 Gauss

Process Pressure: 10 to 80 m Torr

Microwave Power: 1000 to 3000 watts per ion source

Etch Rate: 6000 to 10000 angstroms per minute (up to 20000 angstroms per min locally on raised features)

Throughput: 40 to 60 wafers per hour

Ion Gun 1/Ion Gun 2 included angle: Fixed in range of 35 to
55 degrees.

Ion Gun modulation (Gun 1 vs Gun 2 power): Software controlled.

Charge Dissipation: Via grounded inert gas (Ar) secondary plasma over ESC/wafer surface.

Ion Current density: 3–8 m amps/cm$^2$.

Materials Selection:

HDP Ionization Tubes: Quartz

Electrostatic Chuck Dielectric: Polyamide

Chamber Body and Internal hardware: 6061 T6 Aluminum

Chamber Shielding: Quartz and Ceramic

Dimensions:

A. Ion source 1 and 2

Source tube: 10 inches long by 3 inches in diameter

Accelerator and lens: 5 inches in diameter, about 6 inches long.

B. Process Chamber Size:

14 inches in diameter (cylindrical)

Hemispherical top (mounts supplied for ion guns)

5 to 9 inches tall (this is a key variable)

Figure 2:
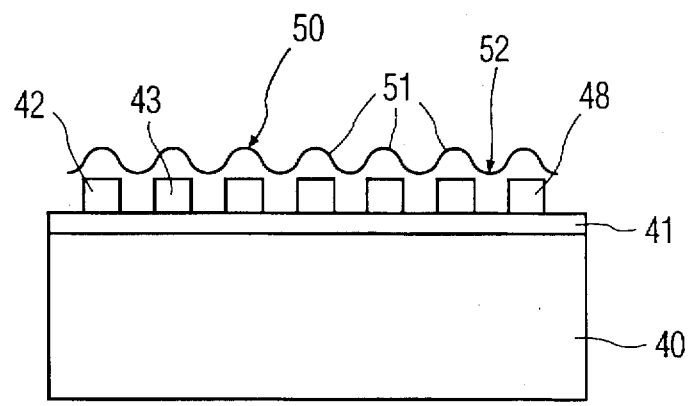
FIGS. 2–4 are schematic side views of a wafer during milling with the apparatus of FIG. 1.
Figure 3:
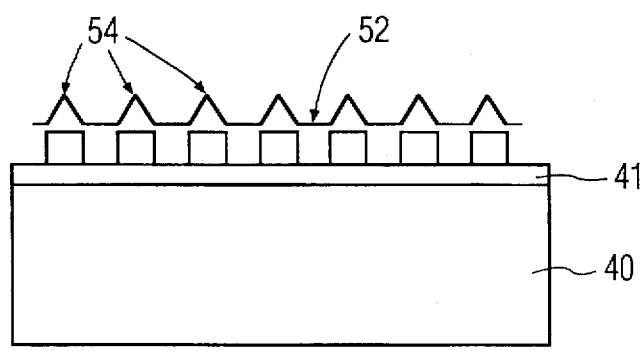
Figure 4:
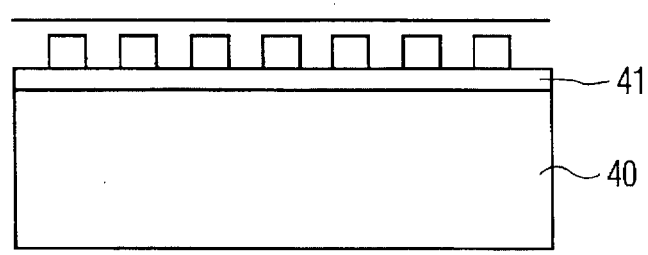

FIGS. 2, 3, and 4 show schematically a typical non-planar feature before and after ion milling by the first ion gun herein and after ion milling by the second ion gun herein. Specifically, FIG. 2 shows a schematic side view of a semiconductor wafer 40 with an epitaxial film 41 on the top surface thereof, as viewed in the figure. The figure also shows illustrative aluminum conductors 42, 43, . . . 48 coated with an extra thick layer 50 (typically 2000 angstrom units thick) of silicon oxide (Quartz) forming hills 51 and valleys 52.

FIG. 3 shows the wafer 40 of FIG. 2 after milling with the first ion gun. The hills 51 of FIG. 2 can be seen to be milled into sharp peaks 54. FIG. 4 shows peaks 54 to be essentially removed with relatively little change in the profile of the valleys 52 thus forming a relatively planar surface for further layer formation thereon.

Figure 5:
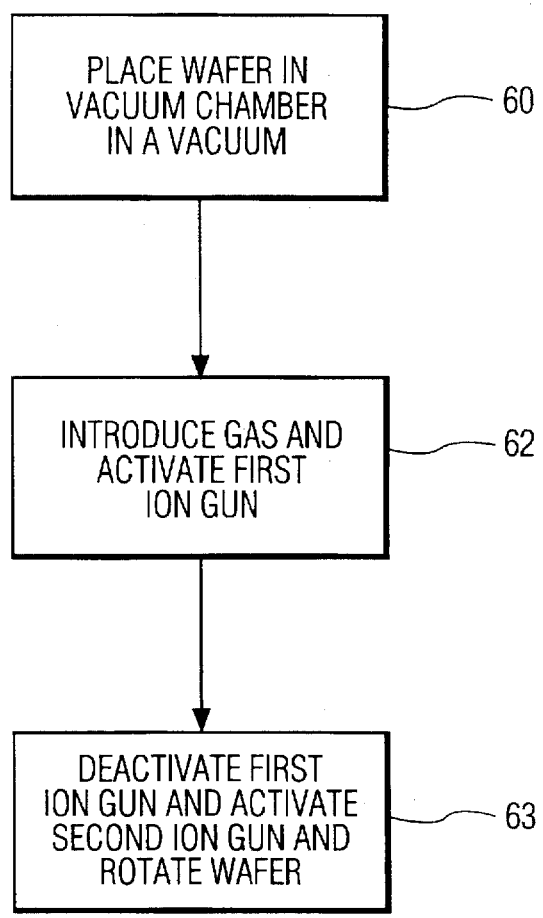
FIG. 5 is a flow diagram of the sequence of steps performed by the apparatus of FIG. 1.

FIG. 5 depicts the sequence of steps of the method for ion milling non-planar surfaces in accordance with the principles of this invention: The method comprises the steps of placing a featured semiconductor wafer in the vacuum chamber of an ion milling machine of the type shown in FIG. 1 and producing a vacuum in the chamber as indicated in block 60 of FIG. 5. Next, the first ion gun is activated to exaggerate the hills of FIG. 2 into the peaks of FIG. 3 as indicated by block 62.

Next, the first ion gun is deactivated and the second gun is activated and the wafer is rotated to mill the exaggerated peaks at a relatively fast rate as indicated by block 63. The second gun directs a beam in a direction essentially normal to the slope of the peaks which is about forty five degrees. Once the slope angle is determined, the orientation of the second gun is fixed. The orientation of the second gun is preset and fixed during manufacture usually. The wafer is rotated during the activation of the second ion gun and can be, and usually is, rotating during the activation of the first ion beam gun also.

Although the invention has been described in connection with the planarization of Quartz, it is also useful for planarizing other materials such as Tungsten.

What is claimed is:

1. Apparatus for ion milling non-planar features on a semiconductor wafer surface, said feature having hills and valleys defined thereby, said apparatus comprising first and second ion beam guns, said first gun being positioned to direct a beam along a direction normal to said surface and including means for directing said beam uniformly over said entire surface, said beam being of an intensity and for a duration to form said hills and valleys into sharp peaks and shallow valleys, said peaks having steep slopes, said second ion beam gun being positioned to direct an ion beam at said slopes and having an intensity and duration to mill said peaks at a rate faster than the rate at which said valleys are milled thereby, said second beam being directed at a radial portion of said wafer as said wafer is rotated, said apparatus including means for rotating said wafer while said second ion gun is activated for reducing the height of said peaks relative to said valleys.

2. Apparatus as in claim 1 wherein said wafer is silicon and said non-planar features are aluminum conductors with silicon oxide insulator layers thereover and therebetween defining said hills thereover and said valleys therebetween.

3. Apparatus as in claim 1 wherein said means for directing said beam uniformly over said entire surface comprises a magnetic lens and said means for rotating also rotates said wafer when said first ion gun is activated.

4. Apparatus as in claim 1 wherein said second ion gun is positioned to direct an ion beam at about a forty five degree angle to said wafer surface.

5. Apparatus as in claim 1 wherein said wafer is secured in said vacuum chamber, said apparatus including means for producing a vacuum in said chamber and wherein said means for rotating comprises an electrostatic chuck and means for rotating said chuck.

6. Apparatus as in claim 5 wherein said apparatus also includes means for introducing gases into said vacuum chamber for ion milling of said non-planar features.

7. Apparatus as in claim 1 wherein said second ion gun is positioned to direct an ion beam in a direction normal to said steep slopes.

8. A method for planarizing non-planar features on a semiconductor wafer, said features including hills with valleys therebetween, said method comprising the step of directing a first ion beam uniformly at said surface for a time and at an intensity to mill said hills into sharp peaks with steep slopes and shallow valleys therebetween, said method also including the step of directing a second ion beam at said steep slopes to mill said peaks at a rate faster than the rate at which said valleys are milled thereby.

9. A method as in claim 8 also including the step of rotating said wafer when said second ion gun is activated and confining said beam from said second gun to only a small radial portion of said wafer surface.

* * * * *